(12) United States Patent
Wu et al.

(10) Patent No.: US 9,996,078 B1
(45) Date of Patent: Jun. 12, 2018

(54) PRE-EMPTIVE FAULT DETECTION THROUGH ADVANCED SIGNAL ANALYSIS

(71) Applicant: PRATT & WHITNEY CANADA CORP., Longueuil (CA)

(72) Inventors: Hai Tao Wu, Sainte-Anne-de-Bellevue (CA); Michael Conciatori, Saint-Leonard (CA); Tommy Woo, Longueuil (CA); Michael Woinowsky-Krieger, Longueuil (CA)

(73) Assignee: Pratt & Whitney Canada Corp., Longueuil, Quebec (CA)

( * ) Notice: Subject to any disclaimer, the term of this patent is extended or adjusted under 35 U.S.C. 154(b) by 0 days. days.

(21) Appl. No.: 15/481,792

(22) Filed: Apr. 7, 2017

(51) Int. Cl.
*G08B 21/00* (2006.01)
*G05B 23/02* (2006.01)
*G01R 31/28* (2006.01)
*F23N 5/00* (2006.01)

(52) U.S. Cl.
CPC ......... *G05B 23/0221* (2013.01); *F23N 5/003* (2013.01); *G01R 31/2829* (2013.01); *G05B 23/0297* (2013.01); *F05D 2260/80* (2013.01); *F05D 2270/09* (2013.01); *F23N 2041/20* (2013.01); *G05B 2219/34477* (2013.01)

(58) Field of Classification Search
None
See application file for complete search history.

(56) References Cited

U.S. PATENT DOCUMENTS

| | | | | |
|---|---|---|---|---|
| 9,459,671 B2* | 10/2016 | Rosson | ...................... | G06F 1/26 |
| 9,545,919 B2* | 1/2017 | Ueno | .................... | B60W 20/50 |
| 9,850,844 B2* | 12/2017 | Bevot | ...................... | F02D 41/28 |
| 2014/0122011 A1 | 5/2014 | Cao et al. | | |
| 2015/0047415 A1 | 2/2015 | Michalske | | |
| 2017/0332926 A1* | 11/2017 | Fischell | ............. | A61B 18/1492 |

\* cited by examiner

*Primary Examiner* — Julie Lieu
(74) *Attorney, Agent, or Firm* — Norton Rose Fulbright Canada LLP

(57) ABSTRACT

Herein provided are methods and systems for detecting failure of a sensor in a control system for a gas turbine engine. A filtered signal is received from the sensor. A high-pass filter is applied to the filtered signal to produce a high-frequency component signal. A rate of occurrence of signal spikes in the high-frequency component signal is determined. The high-frequency component signal is compared to a component signal threshold based on at least one known healthy component signal and at least one faulty component signal, wherein the faulty component signal is based on a known faulty signal caused by intermittent open circuits. The presence of intermittent open circuits caused by the sensor is detected based on the comparing and on the rate of occurrence of signal spikes.

20 Claims, 5 Drawing Sheets

PRE-EMPTIVE FAULT DETECTION THROUGH ADVANCED SIGNAL ANALYSIS

TECHNICAL FIELD

The present disclosure relates generally to aircraft control systems, and, more particularly, to fault detection in aircraft control systems.

BACKGROUND OF THE ART

Modern aircraft include a variety of control systems which are used to regulate the operation of different systems of the aircraft. For example, an engine control system is used to control operation of an engine or other power system of the aircraft. The engine control system makes use of a variety of sensors which provide information to the engine control system about operating conditions of the engine. This information can include environmental conditions, temperature or stress levels or components of the engine, and the like, and is used to modulate the operation of the engine.

However, in certain circumstances the sensors themselves may experience wear and break down or become defective. In some such cases, the sensors begin to provide the engine control system with incorrect and/or inaccurate information, which can cause the engine control system to modulate the operation of the engine in inefficient or potentially damaging ways. While it is possible to adjust the response of the engine control system to a known faulty sensor, it is difficult to know if or when a particular sensor is beginning to become defective.

As such, there is room for improvement.

SUMMARY

In one aspect, there is provided a method for detecting failure of a sensor in a control system for a gas turbine engine, comprising: receiving a filtered signal from the sensor; applying a high-pass filter to the filtered signal to produce a high-frequency component signal; determining a rate of occurrence of signal spikes in the high-frequency component signal; comparing the high-frequency component signal to a component signal threshold based on at least one known healthy component signal and at least one faulty component signal, wherein the faulty component signal is based on a known faulty signal caused by intermittent open circuits; and detecting the presence of intermittent open circuits caused by the sensor based on the comparing and on the rate of occurrence of signal spikes.

In some embodiments, the method further comprises assigning a sensor health value to the sensor based on a rate of occurrence of the intermittent open circuits.

In some embodiments, the method further comprises applying a signal accommodation factor to the filtered signal based on the sensor health value.

In some embodiments, comparing the high-frequency component signal to the component signal threshold comprises comparing an amplitude of the high-frequency component signal to an amplitude threshold.

In some embodiments, comparing the high-frequency component signal to the component signal threshold comprises comparing a timing parameter of the high-frequency component signal to a timing threshold.

In some embodiments, comparing the high-frequency component signal to the component signal threshold comprises comparing a rate of occurrence of at least one signal behaviour of the high-frequency component signal to an occurrence threshold.

In some embodiments, the filtered signal is received during transient operation of the engine.

In some embodiments, the predetermined time constants are first time constants, the method further comprising selecting one of the first time constants and second time constants based on the filtered signal.

In some embodiments, the method further comprises: receiving a signal from the sensor; and filtering the signal to produce the filtered signal.

In some embodiments, the sensor is a temperature sensor.

In accordance with another broad aspect, there is provided a system for detecting failure of a sensor in a control system for a gas turbine engine, comprising: a processing unit; and a non-transitory computer-readable memory having stored thereon program instructions. The program instructions are executable by the processing unit for: receiving a filtered signal from the sensor; applying a high-pass filter to the filtered signal to produce a high-frequency component signal; determining a rate of occurrence of signal spikes in the high-frequency component signal; comparing the high-frequency component signal to a component signal threshold based on at least one known healthy component signal and at least one faulty component signal, wherein the faulty component signal is based on a known faulty signal caused by intermittent open circuits; and detecting the presence of intermittent open circuits caused by the sensor based on the comparing and on the rate of occurrence of signal spikes.

In some embodiments, the program instructions are further executable for assigning a sensor health value to the sensor based on a rate of occurrence of the intermittent open circuits.

In some embodiments, the program instructions are further executable for applying a signal accommodation factor to the filtered signal based on the sensor health value.

In some embodiments, comparing the high-frequency component signal to the component signal threshold comprises comparing an amplitude of the high-frequency component signal to an amplitude threshold.

In some embodiments, comparing the high-frequency component signal to the component signal threshold comprises comparing a timing parameter of the high-frequency component signal to a timing threshold.

In some embodiments, comparing the high-frequency component signal to the component signal threshold comprises comparing a rate of occurrence of at least one signal behaviour of the high-frequency component signal to an occurrence threshold.

In some embodiments, the filtered signal is received during transient operation of the engine.

In some embodiments, the predetermined time constants are first time constants, the method further comprising selecting one of the first time constants and second time constants based on the filtered signal.

In some embodiments, the program instructions are further executable for: receiving a signal from the sensor; and filtering the signal to produce the filtered signal.

In some embodiments, the sensor is a temperature sensor.

BRIEF DESCRIPTION OF THE DRAWINGS

Reference is now made to the accompanying figures in which.

It will be noted that throughout the appended drawings, like features are identified by like reference numerals.

DETAILED DESCRIPTION

Figure 1:
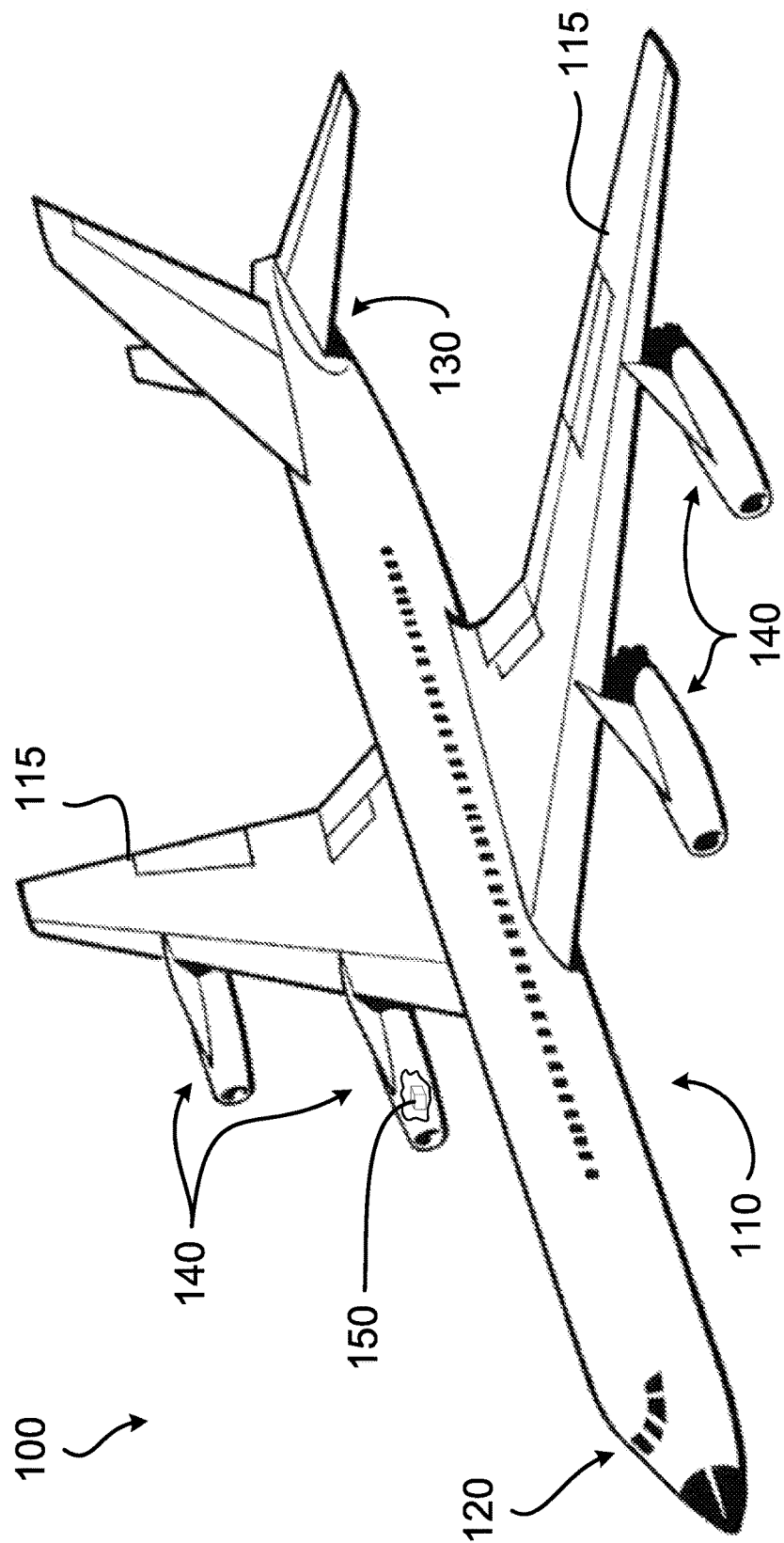
FIG. 1 is a schematic of an example aircraft.

With reference to FIG. 1, there is illustrated an example aircraft 100 having a fuselage 110 and wings 115. The fuselage 110 includes a cockpit 120 and a tailcone 130, which can be substantially integral to the fuselage 110. The aircraft 100 also includes engines 140 which can be affixed to the wings 115 and/or to the fuselage 110. Although shown in FIG. 1 generally as a turbofan aircraft in which the engines 140 are gas turbine engines, it should be noted that the aircraft 100 can be any suitable type of aircraft having any suitable number of engines of any suitable type.

Control of the operation of the engines 140 can be effected by one or more control systems, for example one or more engine control systems (not illustrated). In some embodiments, a single engine control system is configured for controlling operation of all the engines 140. In other embodiments, each of the engines 140 is provided with a respective engine control system. In still further embodiments, the aircraft 100 has a plurality of engine control systems, each of which controls one or more of the engines 140. Still other configurations of engine control systems are considered. For example, the aircraft 100 has a central engine governing system (not illustrated) which in turn controls one or more engine control systems, each of which modulates the operation of one or more of the engines 140. In addition, while the engines 140 are shown as being primary thrust gas turbine engines of the aircraft 100, it should be noted that the embodiments described herein can apply to any suitable gas turbine engine of the aircraft 100, including auxiliary engines, or to any engine of any suitable vehicle, generator, and the like.

The engine control systems are configured for obtaining information from one or more sensors 150, located within or proximal to the engines 140, or at any other suitable location of the aircraft 100. The information obtained by the sensors 150 can be any suitable type of information about the operating conditions of the engines, and can be obtained during transient operation of the engine 140, or during steady-state operation of the engine 140. Transient operation of the engine 140 includes situations where the speed of the engine 140 is varying, for example when a speed of a core or shaft of the engine 140 is varying, where a power produced by the engine 140 is varying, where a load of the engine 140 is varying, and the like. In addition, transient operation of the engine 140 can include situations where other engine parameters are varying, for example an engine core temperature, an oil flow rate to the engine 140 or to any component thereof, a concentration of particulate in exhaust produced by the engine, or any other suitable engine parameter. Steady state operation includes situations where one or more of the aforementioned engine parameters are considered to be stable or unchanging.

In some embodiments, the sensors 150 include one or more environmental sensors which provide information about the external operating conditions of the aircraft, including temperature, air pressure, altitude, precipitation, and the like. In another example, the sensors 150 include one or more stress sensors which provide information about the stress levels of one or more components of the engines 140 and/or of the aircraft 100 generally, including operating temperature, rotation speed, acceleration, torque, and the like. Still other types of sensors 150 are considered.

Although only illustrated in one of the engines 140, it should be noted that the aircraft 100 can include any suitable number of sensors 150 throughout the engines 140, and throughout the aircraft 100 generally. In some embodiments, certain sensors 150 are associated with a specific one of the engines 140. In other embodiments, certain sensors 150 are associated with all of the engines 140, or any suitable subset thereof. For example, an ambient temperature sensor (not illustrated) can be used to provide information about the ambient temperature outside the aircraft 100 to the engine control systems, and this information is associated with all the engines 140. In another example, separate airspeed sensors are provided on each of the wings 115. The engines 140 on a first one of the wings 115 are associated with a first one of the airspeed sensors, and the engines 140 on a second one of the wings 115 are associated with a second one of the airspeed sensors. Still other relationships between sensors 150 and engines 140 are considered.

Over time and/or with use, one or more of the sensors 150 may begin to become defective and/or begin to produce faulty signals. The faulty signals are then provided to the engine control system, which is not aware of the degradation of the sensors 150. Thus, the engine control system interprets the faulty signals as correct, which causes the engine control system to obtain inaccurate measurements as a result of wear or degradation of the sensors 150. For example, if a particular sensor of the sensors 150 is defective and causing intermittent open circuits, the faulty signal received by the engine control system from that particular sensor would be interpreted by the engine control system as showing repeated spikes in the value provided by the sensor. This, in turn, causes the engine control system to wildly vary the operation of the engine in response, which can lead to damage to the engine 140. Additionally, in some cases the faulty signals are caused by wear or degradation of a harness or other set of connecting wires associated with the sensor 150. In the foregoing discussion, it should be noted that any faults associated with the sensor 150 may be associated with the sensor 150 itself, or with a harness of the sensor 150.

Figure 2:
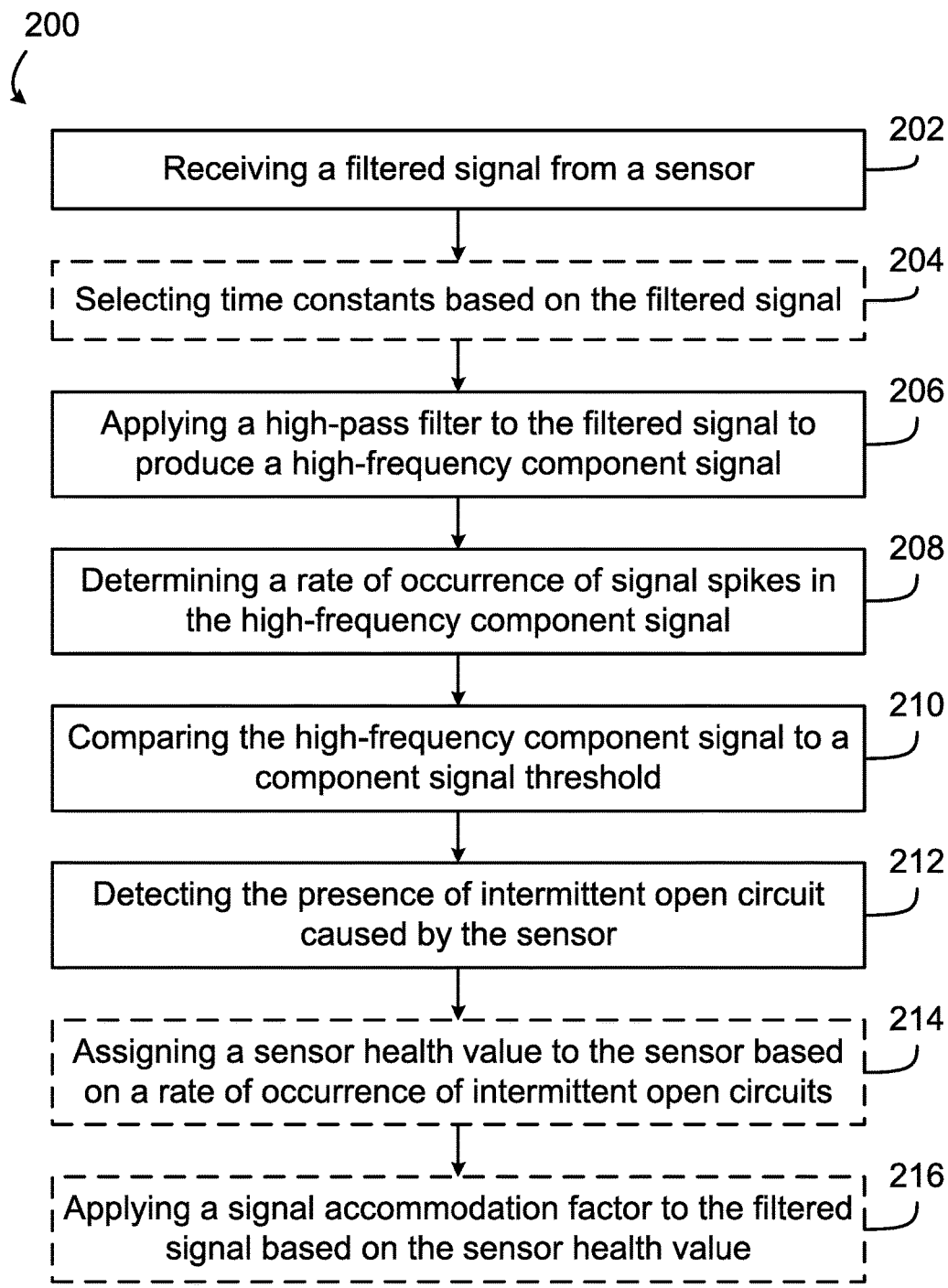
FIG. 2 is a flowchart illustrating an example method for detecting failure of a sensor in a control system for a gas turbine engine, in accordance with an embodiment.

With reference to FIG. 2, in order to detect early signs of failure of sensors 150 and pre-emptively accommodate therefor, a method 200 for detecting failure of a sensor in a control system for an engine, for example a gas turbine engine 140 of the aircraft 100, is shown. At step 202, a filtered signal is received from a sensor, for example any of the sensors 150. In some embodiments, the filtered signal is received during a phase of transient operation of the engine 140. The signal received from the sensor 150 can be any suitable type of raw or encoded signal, and an analog signal or a digital signal. The signal has been previously filtered before being received, for example by one or more hardware filters, one or more software filters, or any suitable combination thereof, described in greater detail herein below.

At step 204, optionally a set of time constants are selected based on the filtered signal. In some embodiments, one of a plurality of sets of predetermined time constants is selected based on the filtered signal. For example, first and second predetermined time constants are defined, and one of the first and second predetermined time constants is selected based on the filtered signal. At step 206, a high-pass filter is applied to the filtered signal. In embodiments where step 204 is performed, the high-pass filter is configured to operate with the selected time constants, for example the selected set of predetermined time constants. In embodiments where step 204 is not performed, the high-pass filter is configured to operate with certain predetermined time constants, for example a default set of time constants.

The high-pass filter applied to the filtered signal at step 206 produces a high-frequency component signal (HFCS) based on the signal received from the sensor 150 at step 202. The high-pass filter may be a software based filter, a hardware-based filter, or any suitable combination thereof, and may be a second-order filter, a third-order filter, a fourth-order filter, or a filter of any other suitable order having the aforementioned predetermined time constants. In other embodiments, the high-pass filter may be any other suitable filter having any suitable order. The choice of time constants, and of the configuration of the high-pass filter generally, is made to accentuate anomalies in the filtered signal and to ignore known normal or expected behaviour by the sensor 150. For example, the high-pass filter is configured to filter out portions of the filtered signal at or around the bandwidth of transmission of the sensor 150, and any filtering associated therewith, including the filtering performed prior to reception of the signal at step 202. In some embodiments, the HFCS is stored in a volatile memory, a non-volatile memory, or in another suitable storage medium.

At step 208, a rate of occurrence of signal spikes in the HFCS is determined. In some embodiments, a spiking criterion is used to determine whether a particular portion of the HFCS constitutes a spike. For example, the spiking criterion defines a spike as a portion of the HFCS where the amplitude is above a maximum threshold for a predetermined period of time. The rate of occurrence of signal spikes can be determined on an absolute basis, for example over the whole duration of the HFCS, or on a relative basis, for example as a number of spikes per second or per millisecond of the HFCS. In some embodiments, certain portions of the HFCS are sampled and the rate of occurrence of signal spikes is extrapolated based on the number or count of signal spikes in the portions of the HFCS.

At step 210, the HFCS is compared to a component signal threshold, in order to determine whether the HFCS is indicative of faults in the sensor. The component signal threshold is based on at least one known healthy component signal and at least one faulty component signal. In some embodiments, the at least one faulty component signal is based on a known faulty signal caused by a sensor known to produce intermittent open circuits. For example, a difference between the known healthy component signal and the faulty component signal can be used to set an acceptable threshold or level at a midpoint therebetween. In another example, the difference between the known healthy and faulty component signals is used to specify a range about the midpoint, for example having a width of one, two, or more standard deviations. Other applications of the known healthy and faulty component signals can be used to determine the component signal threshold.

In some embodiments, the component signal threshold is associated with the amplitude parameter of the signal. For example, the component signal threshold specifies an ideal amplitude, a range of acceptable amplitudes, a problematic amplitude, or any other suitable threshold for the HFCS. The ideal amplitude, for example, is set at an average value between the amplitude of the known healthy component signal and the amplitude of the faulty component signal. Other component signal threshold are also considered. In some embodiments, the component signal threshold is the problematic amplitude, which can be set at a value somewhere between the amplitude of the known healthy component signal and the amplitude of the faulty component signal, for example at the one-quarter mark between the amplitude of the faulty component signal and the amplitude of the known healthy signal.

In other embodiments, the component signal threshold is associated with a timing parameter of the signal. For example, the component signal threshold specifies an acceptable or unacceptable delay between certain signal behaviours in the HFCS, like spikes, zero-crossings, or any other element which is indicative of faults caused by the sensor 150. The delay, for example is set as the average between an average delay between signal behaviours for the known healthy component signal and an average delay between signal behaviours for the faulty component signal.

In still further embodiments, the component signal threshold is associated with a rate of occurrence parameter for the signal. For example, the component signal threshold specifies an acceptable or unacceptable rate of occurrence for the aforementioned signal behaviour in the HFCS which are indicative of faults caused by the sensor 150. The rate of occurrence parameter, for example, is based on an average rate of occurrence for the signal behaviours for the known healthy component signal and the faulty component signal.

In some embodiments, the component signal threshold is based on any suitable combination of the aforementioned signal parameters, or any further signal parameters which indicate faults caused by the sensor 150. Additionally, in some embodiments, the signal behaviour in the HFCS is indicative of intermittent open circuits caused by the sensor 150.

Additionally, in some embodiments, performing step 210 is conditional on the rate of occurrence of signal spikes being compared to a predetermined tolerance of signal spikes. If the rate of occurrence is below the predetermined tolerance, the method 200 returns to some previous step of the method 200, for example step 202. If the rate of occurrence of signal spikes in the HFCS is above the predetermined tolerance, the method 200 proceeds to step 210. In other embodiments, the order of steps 208 and 210 is reversed, and performing step 210 is conditional on whether the comparing is indicative of faults in the sensor. If the comparing is not indicative of faults in the sensor, the method 200 returns to some previous step of the method 200, for example step 202. If the comparing is indicative of faults in the sensor, the method 200 proceeds to step 208. In still further embodiments, step 208 and 210 are performed substantially in parallel, and the method 200 proceeds to step 212 irrespective of the results of steps 208 and 210.

In some embodiments, the predetermined tolerance is stored in a memory or other storage medium. For example, different predetermined tolerances are used for different signals received at step 202, and the relevant predetermined tolerance can be obtained from the storage medium as part of step 208.

At step 212, the presence of intermittent open circuits caused by the sensor 150 is detected, based on comparing the HFCS to the component signal thresholds and based on the rate of occurrence of signal spikes. For example, if the component signal threshold includes a threshold based on the amplitude parameter, the HFCS having an amplitude outside the acceptable amplitude range is indicative of the presence of intermittent open circuits caused by the sensor 150. In another example, if the component signal threshold includes a threshold based on the timing parameter, the HFCS having a number of spikes and/or zero-crossings above the component signal threshold is indicative of the presence of intermittent open circuits caused by the sensor 150. Put differently, based on the comparison between the HFCS and the component signal thresholds and based on the rate of signal spikes, it can be determined whether the sensor 150 is causing intermittent open circuits, thus providing faulty signals. The presence of intermittent open circuits, in turn, is caused by instability, wear, or degradation of the sensor 150, and may be indicative of an imminent failure of the sensor 150. Thus, by detecting the presence of intermittent open circuits, pre-emptive fault detection of the sensor 150 can be accomplished. The signal received from the sensor 150 can be accommodated before complete failure of the sensor 150 occurs, to avoid damaging the engine 140 or operating the engine 140 in an unstable way.

Optionally, at step 214, a sensor health value can be assigned to the sensor 150 based on a rate of occurrence of intermittent open circuits. For example, if the rate of occurrence of intermittent circuits is indicative of a forthcoming failure for the sensor 150, an "imminent failure" sensor health value can be assigned to the sensor 150. In another example, if only occasional intermittent open circuits are detected, an "acceptable" sensor health value can be assigned to the sensor 150. Still other sensor health values, such as "healthy", "replace at next opportunity", and the like may be assigned to the sensor 150 based on the rate of occurrence of intermittent open circuits caused by the sensor 150.

At step 216, optionally a signal accommodation factor is applied to the signal received from the sensor 150. The choice of signal accommodation factor is based on the sensor health value optionally assigned at step 216. As a result, if step 218 is performed, so must step 216. The signal accommodation factor is used to modify the interpretation of signals received from the sensor 150 by the engine control system, for example to ignore certain signal behaviours caused by intermittent open circuits or other faults caused by the sensor 150. Put differently, the signal accommodation factor allows an engine controller to properly correct for forthcoming failure of the sensor 150 by adjusting the way the engine controller interprets signals coming from the sensor 150.

In some embodiments, the signal accommodation factor includes the application of a gain or attenuation to the signal received from the sensor 150. In other embodiments, the signal accommodation factor implements a rolling average process, where the signal provided to the engine control system is a rolling average of the signal over some predetermined amount of time, in order to smooth out spikes or other unwanted signal behaviour. Still other signal accommodation factors may be applied, as appropriate. For example, in some embodiments the signal accommodation factor applied to the sensor 150 rejects the signal received by the sensor 150, and the engine control system will seek to obtain the information previously provided by the sensor 150 from another source.

Based on the rate of occurrence of signal spikes in the HFCS and the comparison of the HFCS to one or more component signal thresholds, the presence of intermittent open circuits caused by the sensor 150 can be determined. The engine control system, or any other suitable controller, aware of the presence of faults caused by the sensor, can then take appropriate measures to ensure that the engine 140 or other system is not caused to operate in a way that leads to damage or degradation of the engine 140. The method 200 described hereinabove may be applied to various types of control systems, including control systems which are susceptible to amplify certain ranges of frequencies. This can include, for example, control systems having transfer functions with high lead terms, derivative control, or other suitable types of anticipation.

Figure 3:
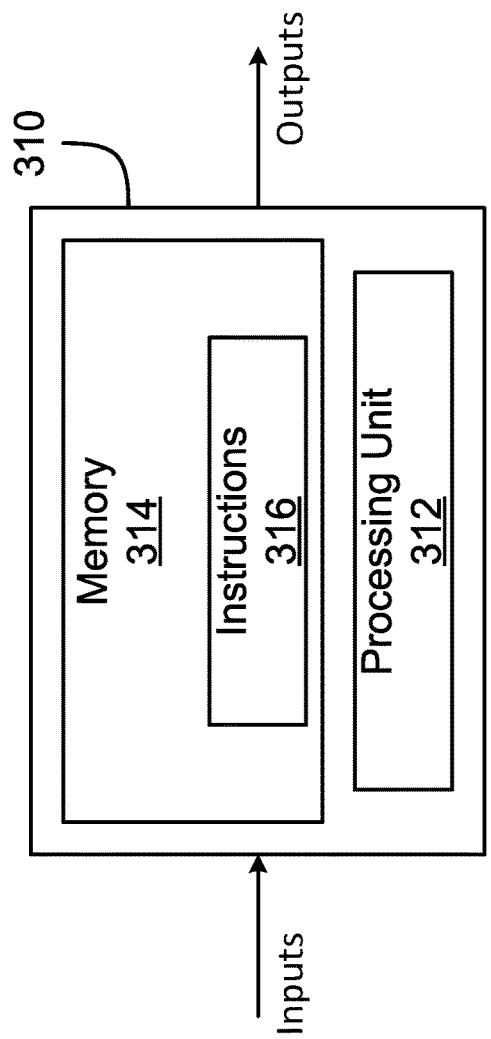
FIG. 3 is a schematic diagram of an example computing system for implementing the method of FIG. 2 in accordance with an embodiment.

With reference to FIG. 3, the method 200 may be implemented by a computing device 310, comprising a processing unit 312 and a memory 314 which has stored therein computer-executable instructions 316. The processing unit 312 may comprise any suitable devices configured to implement the method 200 such that instructions 316, when executed by the computing device 310 or other programmable apparatus, may cause the functions/acts/steps performed as part of the method 200 as described herein to be executed. The processing unit 312 may comprise, for example, any type of general-purpose microprocessor or microcontroller, a digital signal processing (DSP) processor, a central processing unit (CPU), an integrated circuit, a field programmable gate array (FPGA), a reconfigurable processor, other suitably programmed or programmable logic circuits, or any combination thereof.

The memory 314 may comprise any suitable known or other machine-readable storage medium. The memory 314 may comprise non-transitory computer readable storage medium, for example, but not limited to, an electronic, magnetic, optical, electromagnetic, infrared, or semiconductor system, apparatus, or device, or any suitable combination of the foregoing. The memory 314 may include a suitable combination of any type of computer memory that is located either internally or externally to device, for example random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like. Memory 314 may comprise any storage means (e.g., devices) suitable for retrievably storing machine-readable instructions 316 executable by processing unit 312.

Figure 4:
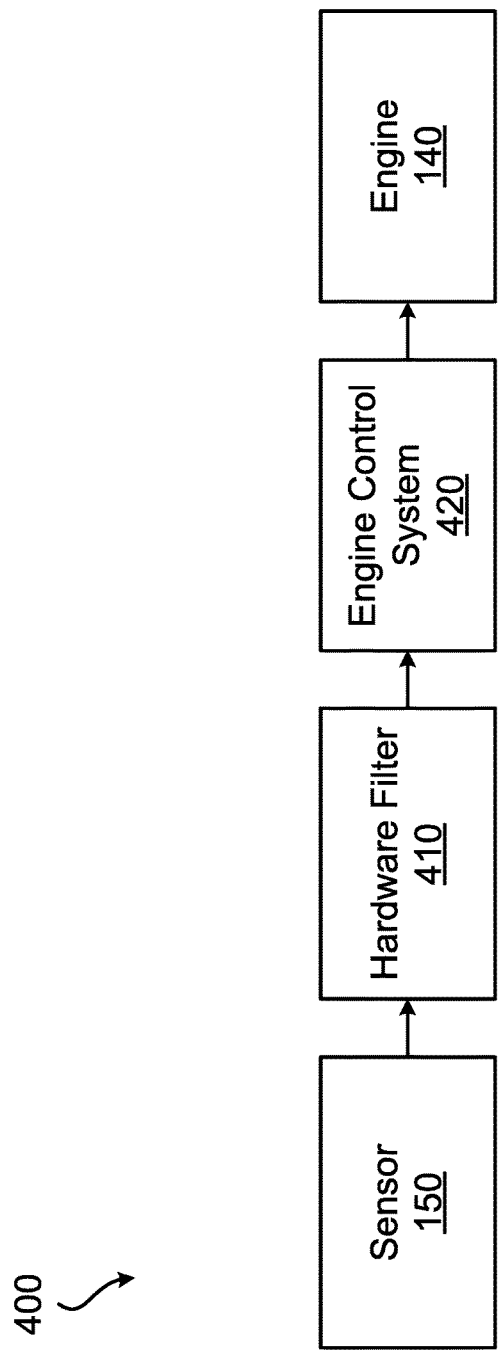
FIG. 4 is a schematic diagram of an example signal path diagram for an engine of the aircraft of FIG. 1.

With reference to FIG. 4, a signal path diagram 400 is shown, which indicates the communication path between the sensor 150 and the engine 140 in an embodiment of the aircraft 100. In some embodiments, a signal from the sensor 150 is sent to one or more hardware filters 410, which filter the signal in any suitable way. In some embodiments, the signal sent by the sensor 150 is sent during transient operation of the engine 140. In other embodiments, the signal sent by the sensor 150 is sent during steady-state operation of the engine 140. For example, the hardware filter 410 may be configured to remove noise from the signal coming from the sensor 150.

The hardware filter 410 then provides the now-filtered signal to an engine control system 420, which in some embodiments is implemented by the computing device 310, and is configured for performing the method 200 based on the filtered signal received from the hardware filter 410. The engine control system 420 can optionally determine a sensor health value for the sensor 150 and accommodate the signal received from the sensor in any suitable fashion. The engine control system 420 can then send one or more control signals to the engine 140 to modulate the behaviour of the engine based on the information received from the sensor 150, after the signal from the sensor has been appropriately accommodated.

Figure 5:
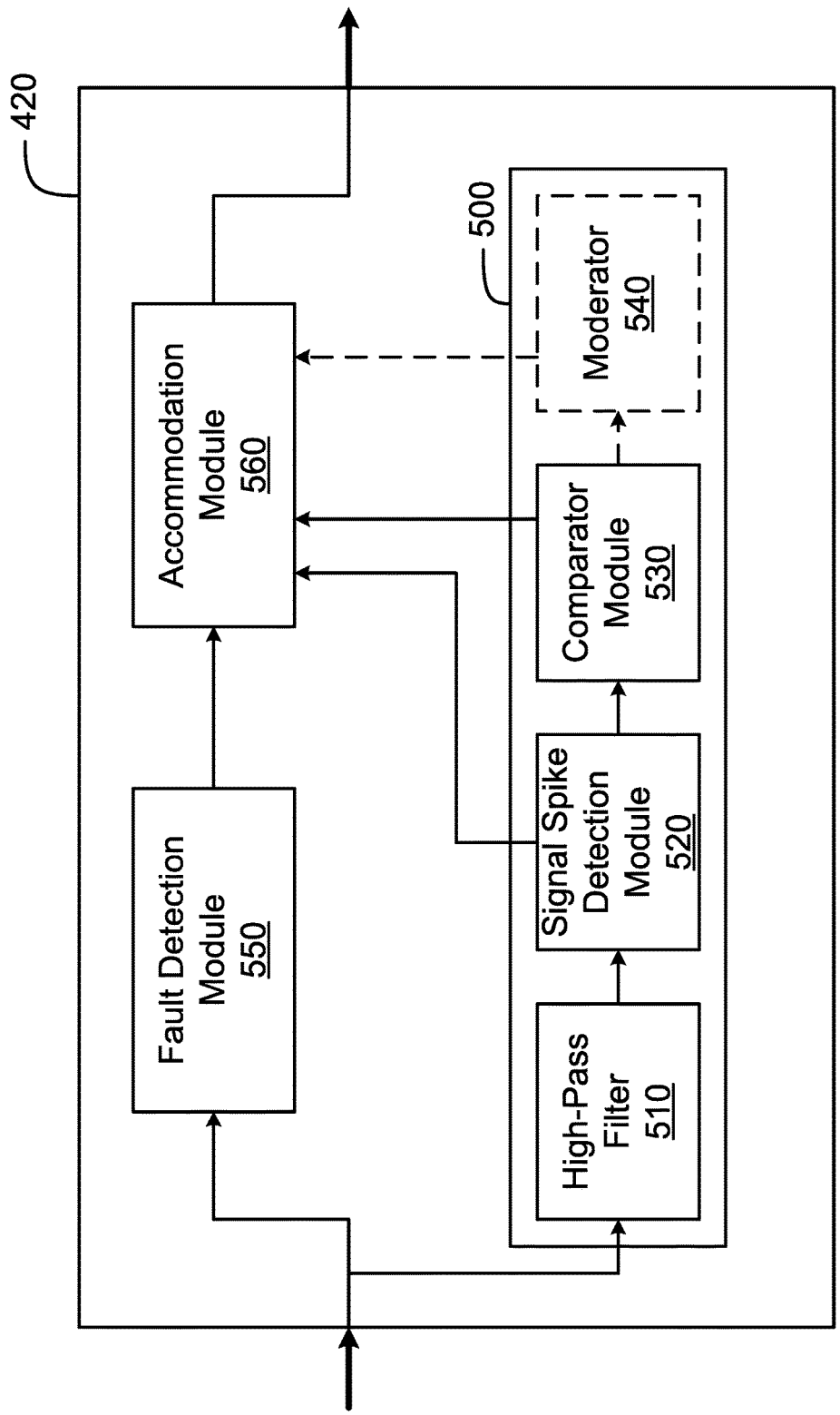
FIG. 5 is a block diagram of an example engine control system.

With reference to FIG. 5, there is shown an example embodiment of the engine control system 420. The engine control system 420 comprises a pre-emptive fault detector 500, a fault detection module 550, and an accommodation module 560.

As discussed hereinabove, the engine control system 420 is configured for receiving the filtered signal from the hardware filter 410. The filtered signal is sent to the fault detection module 550 and to the pre-emptive fault detector 500. The fault detection module 550 is configured for detecting whether the sensor 150 has completely failed, for example by detecting the absence of a signal from the hardware filter 410, or a signal that is stuck at a high-voltage value. The fault detection module 550 can then provide an indication to the accommodation module 560 that the sensor 150 is defective. The fault detection module 550 can be implemented as any traditional fault detection module.

In addition, the filtered signal is provided to the pre-emptive fault detector 500, which includes a high-pass filter 510, a signal spike detection module 520, a comparator module 530, and optionally a moderator 540. The high-pass filter 510 receives the filtered signal and applies a high-pass filter to the filtered signal to produce the high-frequency component signal. The high-pass filter may be a second-order filter, a third-order filter, a fourth-order high-pass filter, or a filter of any other suitable order. For example, the high-pass filter 510 is configured to have time constants which accentuate anomalies in the filtered signal, and which ignore known normal or expected behaviour. For example, the high-pass filter 510 can amplify frequencies of the filtered signal which are indicative of intermittent open circuits caused by the sensor 150. In other embodiments, the high-pass filter may be any other suitable filter having any suitable order, as described hereinabove.

In some embodiments, the high-pass filter 510 is configured for receiving a set of time constants which define the particular filter applied to the filtered signal. The time constants may be selected from one or more sets of predetermined time constants, and in some embodiments are selected based on the filtered signal obtained from the hardware filter 410. The high-pass filter 510 may be a hardware filter, a software filter, or any suitable combination thereof. Additionally, in some embodiments the high-pass filter 510 is a combination of one or more high-pass filters of similar or different orders and/or is combined with one or more additional filters, including low-pass filters, band-pass filters, and the like. The HFCS is then sent to the signal spike detection module 530.

The signal spike detection module 520 is configured for determining a rate of occurrence of signal spikes in the HFCS. In some embodiments, a spiking criterion is used to determine whether a particular portion of the HFCS constitutes a spike. The rate of occurrence can be determined based on the entirety of the HFCS, or based on one or more samples thereof. The signal spike detection module 520 then provides the HFCS and the rate of occurrence of signal spikes to the comparator module 530. In some embodiments, the HFCS and/or the rate of occurrence of signal spikes are only provided to the comparator module 530 if the rate of occurrence of signal spikes is outside a predetermined tolerance of signal spikes. In some embodiments, the signal spike detection module 220 provides an indication of the rate of occurrence of signal spikes to the accommodation module 560.

The comparator module 530 is configured for comparing the HFCS to a component signal threshold, in order to determine whether the HFCS is indicative of faults in the sensor. The component signal threshold is based on at least one known healthy component signal and at least one faulty component signal, as described hereinabove. The at least on faulty component signal is based on a known faulty signal caused by a sensor known to produce intermittent open circuits. In some embodiments, when the comparator module 530 determines the presence of intermittent open circuits caused by the sensor 150, the comparator module 530 provides an indication of the presence of intermittent open circuits caused by the sensor 150, for example a count of intermittent open circuits or a TRUE/FALSE flag, to the moderator 540 and/or to the accommodation module 560. In some embodiments, when the comparator module 530 determines the presence of intermittent open circuits caused by the sensor 150, the comparator module 530 provides the HFCS to the moderator 540.

In some alternative embodiments, the high-pass filter 510 provides the HFCS to the comparator 530, which then performs the comparison of the HFCS to a component signal threshold, and which only provides the HFCS to the signal spike detection module 520 if the HFCS is indicative of intermittent open circuits caused by the sensor 150. Optionally, the comparator module 530 further provides the signal spike detection module 520 with a rate of intermittent open signals. In this alternative embodiment, the signal spike detection module can then determine a rate of occurrence of signal spikes in the HFCS, and provide the moderator 540 with the HFCS and any other suitable information, including the rate of intermittent open signals and/or the rate of occurrence of signal spikes. In some further alternative embodiments, the high-pass filter 510 provides the HFCS to both the signal spike detection module 520 and the comparator module 530, and both modules 520, 530 operate substantially in parallel.

The moderator 540 is configured for receiving from the comparator module 530 the HFCS and, in some embodiments, an indication of the presence of intermittent open circuits caused by the sensor 150. In some embodiments, the moderator 540 is configured for assigning a sensor health value to the sensor 150 based on the indication, and can determine an appropriate signal accommodation factor to apply to the signal coming from the sensor 150 based on the signal health value. Additionally, in some embodiments, the moderator 540 is configured for setting an annunciation indicator associated with the sensor 150 based on the sensor health value and/or the accommodation factor. For example, the moderator 540 can set an alarm or alert signal annunciator, which may be part of a larger annunciator panel, when intermittent open circuits caused by the sensor 150 are detected. In some embodiments, the moderator 540 is not included, and some or all of the functionality described hereinabove is provided by the accommodation module 560.

The accommodation module 560 is configured for receiving the filtered signal from the fault detection module, and if appropriate, any indication of failure of defectiveness of the sensor 150. In addition, the accommodation module 560 is configured for receiving from the signal spike detection module 520, from the comparator module 530, and/or from the moderator 540 an indication of the rate of occurrence of signal spikes in the HFCS and the presence of intermittent open circuits caused by the sensor 150. The accommodation module 560 is further configured for adjusting the filtered signal received from the fault detection module 550 based on the indication received from the moderator 540 the comparator module 530. In some embodiments, the accommodation module 560 assigns a sensor health value to the sensor 150 based on the indication, and can apply a signal accommodation factor based on the signal health value. The accommodation module 560 can then provide instructions to the engine 140 in the form of an accommodated signal based on the filtered signal and any indication of the presence of open circuits caused by the sensor 150, as obtained from the moderator 540 or the comparator module 530. In some embodiments, the accommodation module 560 is configured for setting an annunciation indicator associated with the sensor 150 based on the sensor health value and/or the accommodation factor.

In some embodiments, the accommodation module 560 applies a gain or attenuation to the filtered signal received from the sensor 150. In other embodiments, the accommodation module 560 implements a rolling average process, as described hereinabove. In still further embodiments, the accommodation module 560 rejects the signal received by the sensor 150, and the engine control system 420 will seek to obtain the information provided by the sensor 150 from another source, for example a redundant sensor. Other examples of accommodation factors applied by the accommodation module 560 include using a last good value provided by the sensor 150, using a default value, and using a synthesized value, for example based on information provided by other sensors.

Although the preceding discussion has focused on detecting the presence of intermittent open circuits caused by a sensor in a gas turbine engine of an aircraft, similar techniques can be applied to other engines of the aircraft 100, or any other suitable engine, generator, or other application where sensor degradation is of concern.

The methods and systems for detecting failure of a sensor in a control system for a gas turbine engine described herein may be implemented in a high level procedural or object oriented programming or scripting language, or a combination thereof, to communicate with or assist in the operation of a computer system, for example the computing device 310. Alternatively, the methods and systems for detecting failure of a sensor in a control system may be implemented in assembly or machine language. The language may be a compiled or interpreted language. Program code for implementing the methods and systems for detecting failure of a sensor in a control system may be stored on a storage media or a device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein. Embodiments of the methods and systems for detecting failure of a sensor in a control system for a may also be considered to be implemented by way of a non-transitory computer-readable storage medium having a computer program stored thereon. The computer program may comprise computer-readable instructions which cause a computer, or more specifically the processing unit 312 of the computing device 310, to operate in a specific and pre-defined manner to perform the functions described herein, for example those described in the method 200.

Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the methods and systems for detecting failure of a sensor in a control system for a gas turbine engine may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A method for detecting failure of a sensor in a control system for a gas turbine engine, comprising:
   receiving a filtered signal from the sensor;
   applying a high-pass filter to the filtered signal to produce a high-frequency component signal;
   determining a rate of occurrence of signal spikes in the high-frequency component signal;
   comparing the high-frequency component signal to a component signal threshold based on at least one known healthy component signal and at least one faulty component signal, wherein the faulty component signal is based on a known faulty signal caused by intermittent open circuits; and
   detecting the presence of intermittent open circuits caused by the sensor based on the comparing and on the rate of occurrence of signal spikes.

2. The method of claim 1, further comprising assigning a sensor health value to the sensor based on a rate of occurrence of the intermittent open circuits.

3. The method of claim 2, further comprising applying a signal accommodation factor to the filtered signal based on the sensor health value.

4. The method of claim 1, wherein comparing the high-frequency component signal to the component signal threshold comprises comparing an amplitude of the high-frequency component signal to an amplitude threshold.

5. The method of claim 1, wherein comparing the high-frequency component signal to the component signal threshold comprises comparing a timing parameter of the high-frequency component signal to a timing threshold.

6. The method of claim 1, wherein comparing the high-frequency component signal to the component signal threshold comprises comparing a rate of occurrence of at least one signal behaviour of the high-frequency component signal to an occurrence threshold.

7. The method of claim 1, wherein the filtered signal is received during transient operation of the engine.

8. The method of claim 7, wherein the predetermined time constants are first time constants, the method further comprising selecting one of the first time constants and second time constants based on the filtered signal.

9. The method of claim 1, further comprising:
receiving a signal from the sensor; and
filtering the signal to produce the filtered signal.

10. The method of claim 1, wherein the sensor is a temperature sensor.

11. A system for detecting failure of a sensor in a control system for a gas turbine engine, comprising:
a processing unit; and
a non-transitory computer-readable memory having stored thereon program instructions executable by the processing unit for:
receiving a filtered signal from the sensor;
applying a high-pass filter to the filtered signal to produce a high-frequency component signal;
determining a rate of occurrence of signal spikes in the high-frequency component signal;
comparing the high-frequency component signal to a component signal threshold based on at least one known healthy component signal and at least one faulty component signal, wherein the faulty component signal is based on a known faulty signal caused by intermittent open circuits; and
detecting the presence of intermittent open circuits caused by the sensor based on the comparing and on the rate of occurrence of signal spikes.

12. The system of claim 11, the program instructions being further executable for assigning a sensor health value to the sensor based on a rate of occurrence of the intermittent open circuits.

13. The system of claim 11, the program instructions being further executable for applying a signal accommodation factor to the filtered signal based on the sensor health value.

14. The system of claim 11, wherein comparing the high-frequency component signal to the component signal threshold comprises comparing an amplitude of the high-frequency component signal to an amplitude threshold.

15. The system of claim 11, wherein comparing the high-frequency component signal to the component signal threshold comprises comparing a timing parameter of the high-frequency component signal to a timing threshold.

16. The system of claim 11, wherein comparing the high-frequency component signal to the component signal threshold comprises comparing a rate of occurrence of at least one signal behaviour of the high-frequency component signal to an occurrence threshold.

17. The system of claim 11, wherein the filtered signal is received during transient operation of the engine.

18. The system of claim 17, wherein the predetermined time constants are first time constants, the method further comprising selecting one of the first time constants and second time constants based on the filtered signal.

19. The system of claim 11, the program instructions being further executable for:
receiving a signal from the sensor; and
filtering the signal to produce the filtered signal.

20. The system of claim 11, wherein the sensor is a temperature sensor.

* * * * *